United States Patent [19]

Takeda

[11] Patent Number: 5,116,700

[45] Date of Patent: May 26, 1992

[54] POWER SOURCE ELEMENT WITH CONNECTING TERMINALS

[75] Inventor: Kazutoshi Takeda, Sendai, Japan

[73] Assignee: Seiko Electronics Components Ltd., Japan

[21] Appl. No.: 468,597

[22] Filed: Jan. 23, 1990

[30] Foreign Application Priority Data

Jan. 23, 1989 [JP] Japan .................. 1-6179[U]

[51] Int. Cl.⁵ .............................. H01M 2/22
[52] U.S. Cl. ................... 429/121; 429/178; 439/84; 439/870
[58] Field of Search ......... 429/121, 178, 98; 439/78, 79, 83, 84, 870

[56] References Cited

U.S. PATENT DOCUMENTS

| 3,149,894 | 9/1964 | Fox ................................ 439/79 |
| 3,284,605 | 11/1966 | Anderson et al. ............. 439/870 X |
| 3,706,065 | 12/1972 | Knitter et al. ................ 439/83 X |
| 4,060,668 | 11/1977 | Goebel ........................ 429/178 X |
| 4,904,192 | 2/1990 | Holden et al. ................ 439/78 |

FOREIGN PATENT DOCUMENTS

| 955667 | 10/1974 | Canada ........................ 439/78 |
| 644990 | 12/1978 | Switzerland . |
| 997204 | 7/1965 | United Kingdom ............. 439/870 |
| 2093612 | 2/1982 | United Kingdom . |
| 2169448 | 7/1986 | United Kingdom . |
| 2202682 | 9/1988 | United Kingdom . |

OTHER PUBLICATIONS

Byrnes, *IBM Technical Disclosure Bulletin*, "Injectable Solderable Terminal Pins", vol. 9, No. 4, p. 366, Sep. 1966.

Primary Examiner—Stephen Kalafut
Attorney, Agent, or Firm—Bruce L. Adams; Van C. Wilks

[57] ABSTRACT

The power source unit utilizes a pair of connecting terminal pieces, each having a planar base portion bonded to one of positive and negative terminals of a power source element, and a planar top end portion twisted perpendicular to the planar base portion and designed to connected to a circuit board for mounting of the power source element. By such construction, the total mounting height of the power source element and the circuit board can be reduced, and the connecting strength can be improved between the power source element and the circuit board.

10 Claims, 3 Drawing Sheets

POWER SOURCE ELEMENT WITH CONNECTING TERMINALS

BACKGROUND OF THE INVENTION

The present invention relates to a power source element with connecting terminals, and more specifically relates to a power source element of the type having particular connecting terminal pieces welded to the element.

The conventional power source element with connecting terminals has constructions as shown in FIG. 3A or FIG. 3B. The FIG. 3A construction is comprised of a power source element 10, a pair of negative connecting terminal pieces 13 and positive connecting terminal pieces 14 welded to the element, and a circuit board 12. The element is mounted in parallel to the circuit board. The pair of connecting terminal pieces 13 and 14 are inserted into the circuit board and are soldered thereto, if necessary. The FIG. 3B construction is comprised of a power source element 10, a pair of negative connecting terminal piece 15 and positive connecting terminal piece 16 welded to the element, and a circuit board 12. The element is mounted perpendicularly on the circuit board 12. The pair of connecting terminal pieces 15 and 16 are inserted into the circuit board 12 and are soldered thereto, if necessary.

The conventional connecting terminal piece has shapes as shown in FIG. 4A and FIG. 4B. Referring to FIG. 4A, a folded connecting terminal piece 17 has a relatively great width in the order of 3 mm to 4 mm and is formed such that a tip end portion has a relatively small width of 0.75 mm. This tip end portion is provided with solder plating, if necessary. Referring to FIG. 4B, a planar connecting terminal piece 18 has similar shape and dimension to those of the connecting terminal piece 17.

The conventional power source element integrated with the connecting terminal pieces is arranged on a circuit board such that a total thickness or height of the power source element and the circuit board has a relatively great dimension, thereby causing drawback that the final product may have a great thickness. Further, the conventional connecting terminal piece integrated to the power source element has a narrow tip end portion of a relatively small mechanical strength, thereby causing drawbacks such as folding or bending of the tip end portion and deformation thereof.

SUMMARY OF THE INVENTION

In order to eliminate the above noted drawbacks, an object of the present invention is to provide an improved structure utilizing a connecting terminal piece having a base planar portion fixed by welding to positive and negative terminals of a power source element and having a top end planar portion twisted relative to the base planar portion by 90° such that the total height of the power source element and a circuit board to which the power source element is mounted is considerably reduced, and further the connecting strength is increased between the power source element and the circuit board.

DESCRIPTION OF THE INVENTION

Figure 2A:
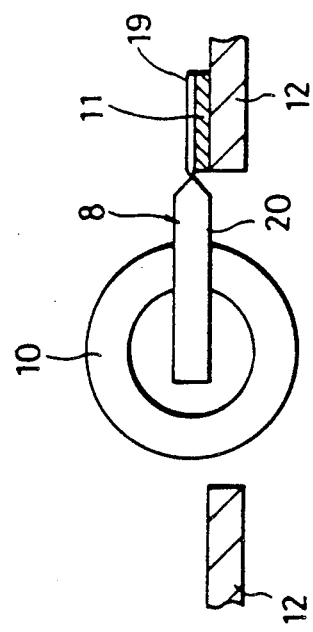
FIG. 2A is a sectional view showing mounting structure of the inventive power source unit on a circuit board.
Figure 2B:
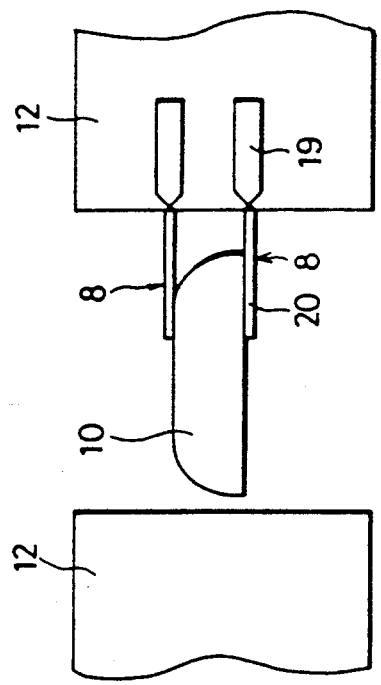
FIG. 2B is a plan view of the same mounting structure.

FIGS. 2A and 2B show a fundamental feature of the present invention. FIG. 2A is a sectional view showing mounting structure of the inventive power source element with connecting terminal pieces or power source unit in a circuit board. In the figure, the power source unit is comprised of a power source element 10, and a connecting terminal piece 8 according to the present invention, which is fixed to a circuit board 12 through a solder bonding portion 11. As seen from this figure, the power source element 10 is disposed in a recess of the circuit board 12 or disposed outside the periphery of the circuit board 12 so as to reduce the total height of the circuit board containing the power source element to thereby reduce the size of a final product utilizing the circuit board.

FIG. 2B is a plan view showing the same mounting structure. The power source element 10 is provided with a pair of the connecting terminal pieces 8 connected to the circuit board 12. As seen from this figure, each connecting terminal piece 8 has a top end portion 19 having a relatively large area effective to increase the bonding strength by soldering between the top end portion 19 of the connecting terminal piece 8 and the circuit board 12. Besides that the bonding strength is great between the connecting terminal piece 8 and the circuit board 12, the connecting terminal piece 8 itself has reinforcement structure that a plane of a supporting or base portion 20 of the piece 8 is arranged perpendicular to that of the top end portion 19, effective to sufficiently support weight of the power source element 10. Moreover, the top end portion 19 of the connecting terminal piece 8 is provisionally coated with tin plating film or solder plating film effective to facilitate the mounting work to the circuit board and to improve the bonding strength.

EMBODIMENTS

Hereinafter, embodiments of the present invention are described in conjunction with the drawings.

Embodiment 1

Figure 1A:
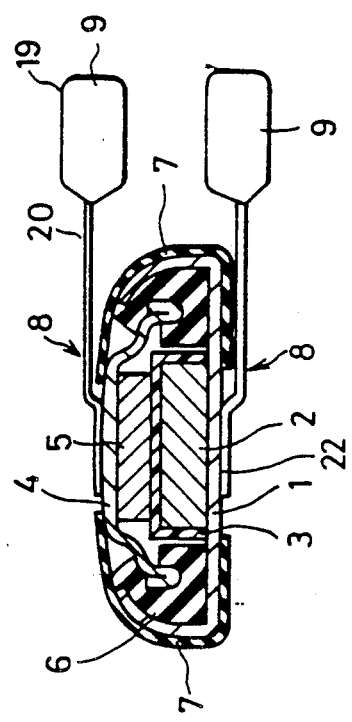
FIG. 1A is a sectional view showing one embodiment of the inventive power source element with connecting terminal pieces or power source unit.
Figure 1B:
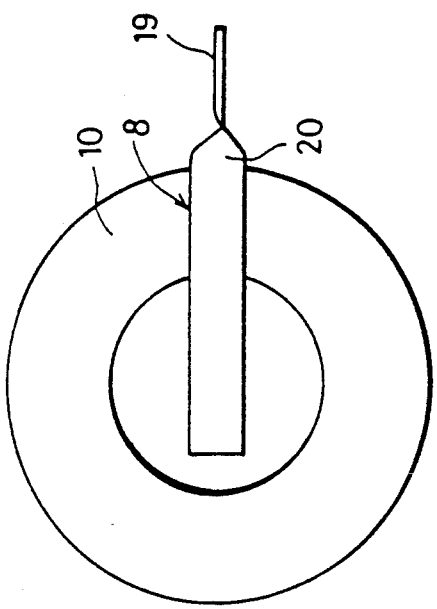
FIG. 1B is a plan view of the same embodiment.
Figure 3A:
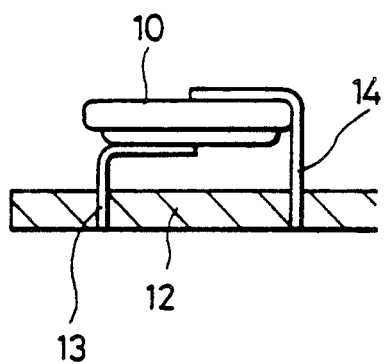
FIG. 3A is a sectional view showing mounting structure of a conventional power source unit on a circuit board.
Figure 4A:
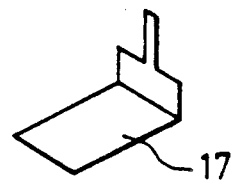
FIG. 4A is a perspective view showing a shape of a conventional connecting terminal piece.
Figure 3B:
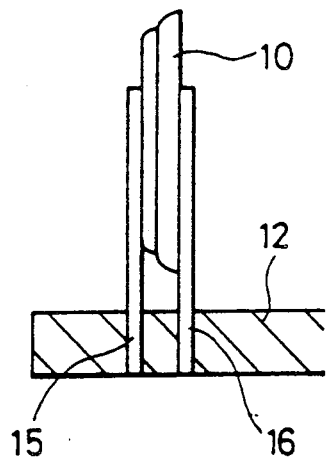
FIG. 3B is a sectional view showing mounting structure of another conventional power source unit.
Figure 4B:
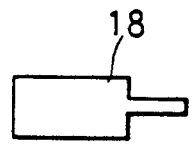
FIG. 4B is a perspective view showing a shape of another conventional connecting terminal piece.
Figure 5A:
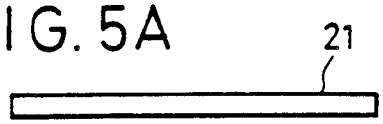
FIG. 5A-5D are illustrative views showing manufacturing steps of one embodiment of the inventive connecting terminal piece.
Figure 5B:
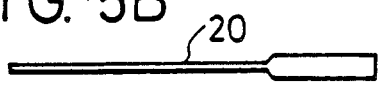
Figure 5C:
Figure 5D:

FIGS. 1A and 1B are sectional and plan views, respectively, of one embodiment of the power source unit according to the present invention. Referring to these figures, the power source element 10 is composed of a button battery, for example, CR1220 (voltage 3 V, standard capacity 35 mAH). The battery is comprised of a positive terminal can 1, a positive active mixture 2, a separator 3, a negative terminal can 4, a lithium film 5, a gasket 6, and a thermally shrinkable tube 7 for insulating the positive and negative terminals from each other. The pair of connecting terminal pieces 8 are welded to the face of positive terminal can 1 and the face of negative terminal can 4, respectively, with the bonding strength more than 2 kg. Each connecting terminal piece 8 has a top end portion 19 twisted relative to a base portion 20 by 90° and coated on at least one face with a solder plating 9. As shown in FIG. 2B, the inventive power source unit including the element 10 is mounted to the circuit board 12 through the connecting terminal pieces 8. Each connecting terminal piece 8 is composed of a strip of thin plate made of nickel or stainless steel and having a thickness of 0.1–0.2 mm and a uniform width of 2–4 mm. Further, the connecting terminal piece 8 has the top end portion 19 which is coated with thin plating or solder plating film on one or both of the faces thereof, and has a 90° twisted shape.

Embodiment 2

FIG. 5 shows one embodiment of manufacturing steps of a connecting terminal piece according to the present invention. In the first step (A), there is provided a connecting terminal material 21 composed of a rod made of stainless steel and having a diameter of 1.0 mm. In the second step (B), a major length part of the rod is formed by pressing into a planar base portion 20 having a thickness of 0.2 mm and a width of 4 mm. Next in the third step (C), a remaining minor length part of the rod is formed by pressing in a direction parallel to the plane of the base portion 20 into a planar top end portion 19 having the same thickness of 0.2 mm and the same width of 4 mm. Thus, the plane of the base portion 20 is twisted perpendicular to that of the top end portion 19. Lastly in the fourth step (D), an end section of the base portion 20 is formed by punching into a step portion 22.

Figure 6:
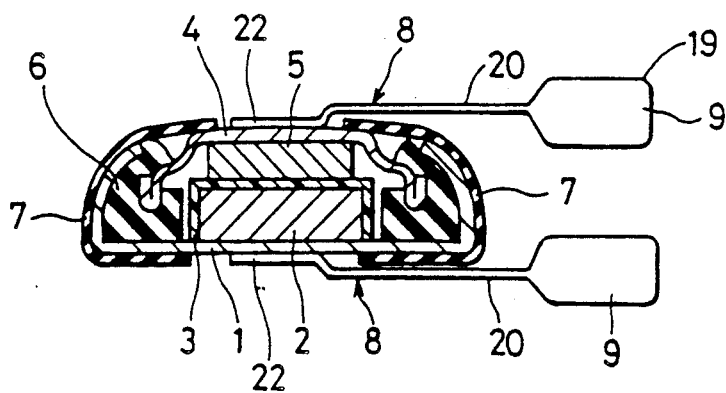
FIG. 6 is a sectional view showing another embodiment of the inventive power source unit.

FIG. 6 is a sectional view showing another embodiment of the inventive power source unit utilizing the connecting terminal pieces produced by the above described method. In similar manner to the first embodiment, the pair of connecting terminal pieces 8 are welded at their step portions 22 to the face of negative terminal can 4 and the face of positive terminal can 1, respectively, to constitute the power source unit such that the respective top end portions 19 are arranged perpendicular to the base portion 20 so that the power source unit can be mounted through the top end portions 19 in a recess of the circuit board or outside the circuit board around the periphery. Moreover, the top end portion 19 of the connecting terminal piece 8 is coated on one or both of its faces with tin plating or solder plating film effective to facilitate the mounting work to the circuit board and effective to increase the bonding strength.

Embodiment 3

Figure 7A:
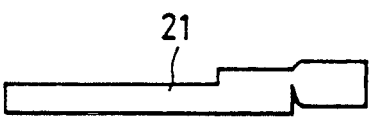
FIGS. 7A and 7B are illustrative views showing manufacturing steps of another embodiment of the inventive connecting terminal piece.
Figure 7B:
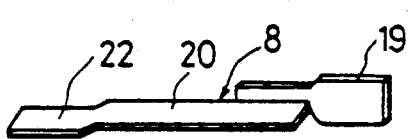

FIG. 7 shown manufacturing steps of another embodiment of the connecting terminal piece according to the present invention. In the first step (A), a stainless steel plate is die-punched to form a connecting terminal material 21. In the second step (B), by folding and punching of the material 21, the connecting terminal piece 8 is shaped such that it has a base portion 20, top end portion 19 perpendicular to the base portion 20, and a step portion 22. The thus formed connecting terminal pieces 8 are utilized to produce a power source unit in similar manner to the first embodiment, thereby achieving the same effect.

The connecting terminal piece can be bonded to the power source element by pressure bonding, soldering and so on instead of welding. These bonding methods can be suitably selected to achieve the same inventive effect.

The power source element may be comprised of a battery, electric double layer capacitor and so on. The power source element may have various shapes such as cylindrical, pin-like, cubic, and paper-like ones.

As described above, according to the present invention, the connecting terminal piece has a planar base portion bonded to the power source element and a planar top end portion twisted perpendicular to the base portion and designed to connect to a circuit board etc. so as to constitute a power source unit. By such construction, the power source unit can be mounted in the circuit board such that the total height of the mounting structure and the products can be reduced and such that the power source element can be firmly connected to the circuit board. The present invention can be applied to various electronic instruments and has great industrial value.

What is claimed is:

1. A power source unit comprising:
    a power source element having a positive terminal and a negative terminal;
    a pair of connected terminal pieces, each having a planar base portion bonded to the respective terminal of the power source element and a planar top end portion twisted perpendicular to the planar base portion, each planar base portion facing in parallel with the other planar base portion; and
    the planar top end portion being positioned outside the outer perimeter of the power source element.

2. A power source unit according to claim 1; wherein the power source element comprises a battery having opposed positive and negative terminal faces, and each connecting terminal piece has a planar base portion welded to the respective terminal face of the battery.

3. A power source unit according to claim 1; wherein each connecting terminal piece comprises an elongated piece having a base portion with a step portion and a planar top end portion twisted with each other.

4. A power source unit according to claim 1; wherein the planar top end portion has thereon a plating film effective to facilitate mounting of the power source unit to a circuit board.

5. A power source unit according to claim 1; wherein the connecting terminal piece is a pressed rod material.

6. A power source unit according to claim 1; wherein the connecting terminal piece comprises at least one of a folded strip material and a punched strip material.

7. A power source unit according to claim 1; wherein the power source element comprises an electric double layer capacitor having opposed positive and negative terminal faces, and each connecting terminal piece has a planar base portion welded to the respective terminal face of the electric double layer capacitor.

8. A power source unit according to claim 1; wherein the power source element is covered with a thermally shrunk tube having open center portions exposing the positive terminal and negative terminal.

9. A power source unit according to claim 1; wherein the connecting terminal piece is a strip of thin plate made of nickel or stainless steel and having a thickness of 0.1-0.2 mm and a uniform width of 2-4 mm.

10. A power source unit according to claim 1, in combination with a circuit board, wherein the terminal pieces of power source unit are bonded to the circuit board and the power source element is disposed in a recess of the circuit board, whereby the total height of the power source circuit board combination can be reduced.

* * * * *